United States Patent [19]

Sadamatsu

[11] Patent Number: 5,764,073
[45] Date of Patent: Jun. 9, 1998

[54] METHOD OF ESTIMATING THE RELIABILITY OF MODULE CIRCUITS

[75] Inventor: Hideaki Sadamatsu, Hirakata, Japan

[73] Assignee: Matsushita Electric Industrial Co., Ltd., Osaka, Japan

[21] Appl. No.: 651,778

[22] Filed: May 22, 1996

[30] Foreign Application Priority Data

Jun. 19, 1995 [JP] Japan .................. 7-151585

[51] Int. Cl.$^6$ ........................... G01R 31/26
[52] U.S. Cl. ..................... 324/765; 395/183.01
[58] Field of Search ..................... 324/765, 751;
437/17, 214, 215; 395/180, 183.2, 183.16,
184.01, 183.01; 438/14, 17

[56] References Cited

U.S. PATENT DOCUMENTS 5,196,354  3/1993  Ohtaka et al. .................. 437/17
5,426,375  6/1995  Roy et al. ...................... 324/769

FOREIGN PATENT DOCUMENTS 4-235361  8/1992  Japan.
6-42986   2/1994  Japan.

Primary Examiner—Ernest F. Karlsen
Assistant Examiner—Anh Phung
Attorney, Agent, or Firm—Ratner & Prestia

[57] ABSTRACT

A method for estimating the reliability of modular circuits by conducting an accelerated life test of components comprising a modular circuit, applying the acceleration factor, etc. on test data thus obtained, and calculating a time to reach a predetermined rate of deterioration as the life time. By adding actual working conditions to the rate of deterioration, a minimum value for determining the deterioration of characteristics is obtained. A component having a value not higher than the minimum value or a rate not lower than the characteristic rate of degradation is then mounted on a printed circuit board comprising the modular circuit, to confirm whether the modular circuit functions normally.

23 Claims, 2 Drawing Sheets

# METHOD OF ESTIMATING THE RELIABILITY OF MODULE CIRCUITS

BACKGROUND OF THE INVENTION

The present invention relates to a method of estimating the reliability of module circuits.

Electronic facilities for use in an industrial plant are usually equipped with a built-in device for forecasting the life of module circuits.

Conventionally, the following method has been known as a method for forecasting the life of module circuits; wherein, based on the main physical quantity and environmental quantity found out of a module circuits, the life of a component is forecast through the operation using an acceleration factor for the component life, physical parameter, corresponding to the environment, data on the environmental parameter and the work hours; and a warning signal is issued when the degradation of a component reaches a certain level.

In television receivers or other consumer appliances, however, it is hard to install such a device as described above for measuring the life, because:

(1) The scale of device is large, and too costly.
(2) It needs a huge software, as each of the module circuits has to be provided with various empirical data for compensation factors, etc.
(3) Each of the module circuits requires to be provided with an environmental sensor.

Furthermore, a difficulty in estimating the reliablity of module circuits lies in a fact that the life of a constituent component in module circuits is influenced by the heat treatment during manufacture and the temperature of operating environment; and circuits for a new model often contain other different components.

Therefore, in order to estimate the reliability of a new module circuits, the reliability test has to be conducted every time when a new module circuits is introduced. In practice, however, a full-scale accelerated life test is not always completed before shipment date, which renders the reliability assurance based on estimated life impossible.

SUMMARY

The present invention aims to offer a method of estimating the reliability of module circuits, without using a large scale testing facilities needed in conventional methods. The present invention also aims to make the reliability assurance based on estimated life possible even when a full-scale accelerated life test is inpracticable because of limited time by the date of shipment.

In order to solve the aforementioned problems in prior art methods, a method according to the present invention to estimate the reliability of module circuits conducts in the first place an accelerated life test of constituent components on the module circuits for comprehending the degradation status of the components; and, the rate of deterioration of a component from the initial value to a specified degradation value and the life time are calculated based on the above described degradation status. And then, a component corresponding to the degradation value is mounted on a printed circuit board constituting the module circuits to confirm whether or not the module circuits work with the normal functioning; the reliability estimation of a module circuits is made through such procedure.

The method according to the present invention obtains the life time of a component based on the rate of deterioration using the above described constitution, making it possible to confirm the functioning state at the life end point even when a full-scale accelerated life test of module circuits is inpracticable before shipment date.

As a result, the reliability confirmation and the quality assurance of a product can be made before shipment of a product; this brings about a substantial advantage in many practical occasions. Furthermore, the method does not require any large-scale facilities, which leads to a reduced cost and enables to apply the method to consumer appliances.

DESCRIPTION OF THE PREFERRED EMBODIMENTS

In the following, description is made on a method for estimating the reliability of module circuits shown in FIG. 2, in accordance with the procedure of flowchart in FIG. 1, referring to the life characteristics chart of an electrolytic capacitor shown in FIG. 3.

Figure 2:
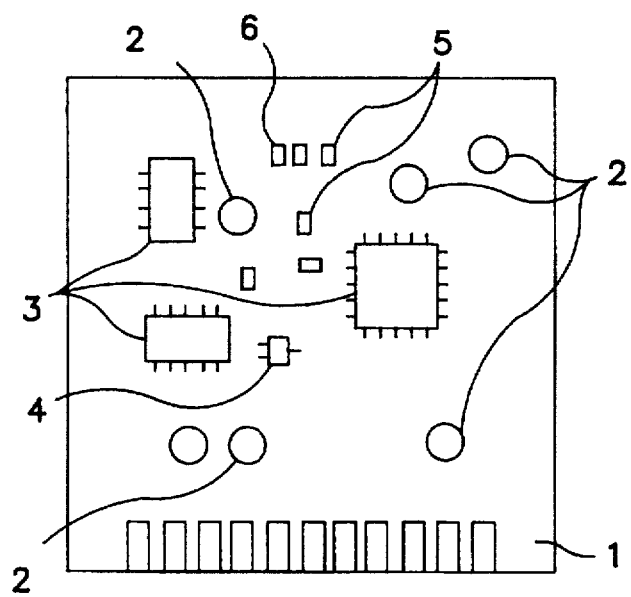
FIG. 2 shows a module circuits presented for the purpose of explaining FIG. 1.

A module circuits of FIG. 2 is comprised of an electrolytic capacitor 2, a semiconductor integrated circuits 3 such as IC or LSI, a transistor 4, a resistor 5, a ceramic capacitor 6 disposed at specified place on a printed circuit board 1 having specific circuit pattern, and soldered. Although in FIG. 2 only specific components are shown, the printed circuit board may have other components, in addition to the above described.

The reliability life of a module circuits is dependent on the life of a component having the shortest life among the constituent components. In a module circuits according to an embodiment as shown in FIG. 2, the characteristics degradation with the passage of time seems to be most significant and the fastest with electrolytic capacitor 2, among other components such as semiconductor integrated circuits 3, transistor 4, resistor 5, ceramic capacitor 6. Therefore, in the present embodiment, a method of estimating the reliability of module circuits is described with the focus on electrolytic capacitor 2.

Figure 1:
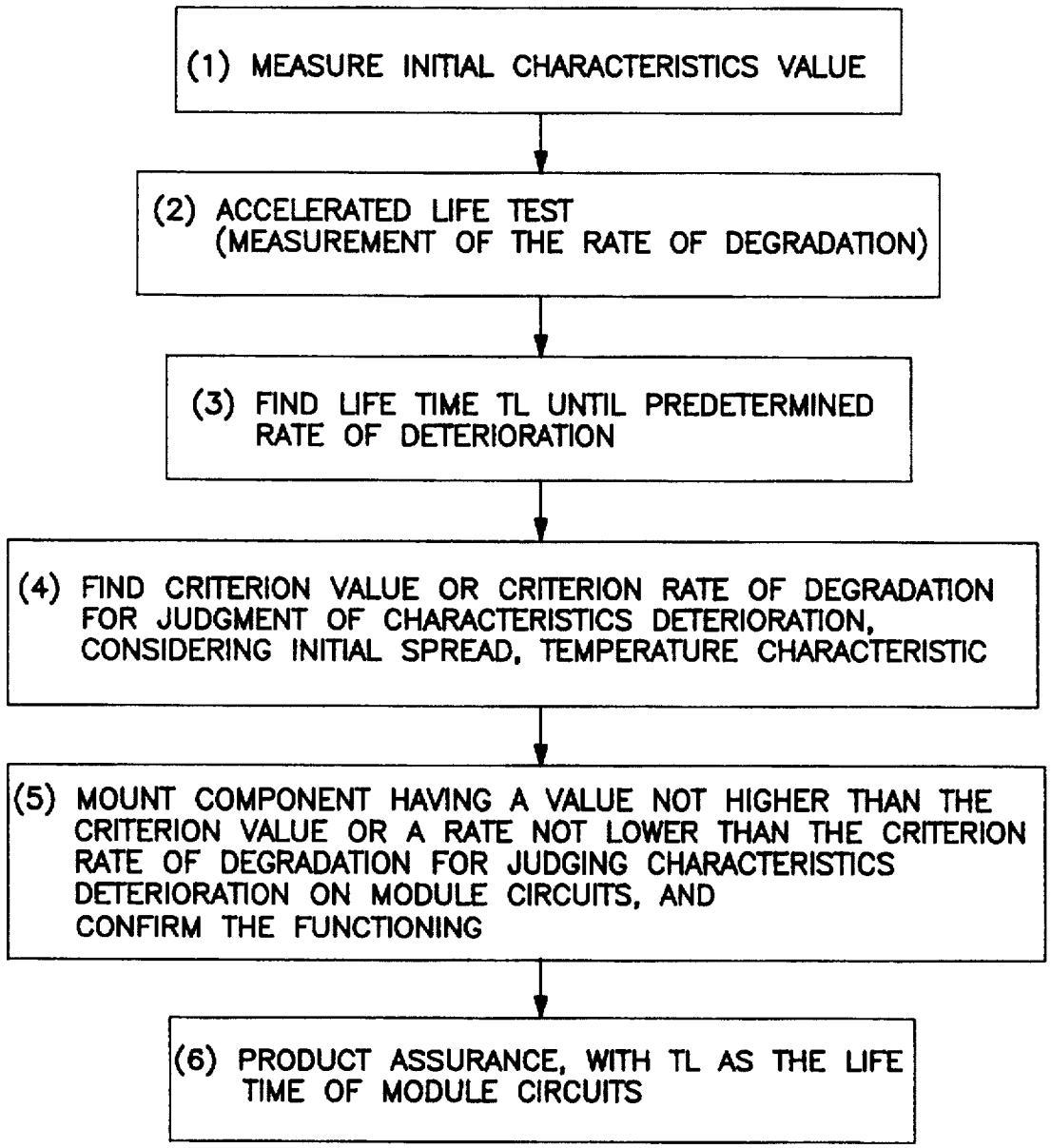
FIG. 1 is flowchart of a method of estimating the reliability of module circuits according to an embodiment of the present invention.

As shown in the flowchart of FIG. 1, the initial value of electrolytic capacitor 2 built on a sample module circuits is measured in the capacitance, tanγ and other items needed, and the data thus obtained are stored in a memory whenever necessary [Procedure (1)]. And then, the change (degradation) in capacitance value and other characteristics items is measured after conducting an accelerated life test on the sample module circuits for a predetermined time (e.g. 600 h) [Procedure (2)]. The accelerated life test is conducted by applying rated voltage on the module circuits in an atmosphere, for example, 85° C. temperature and 0% humidity.

Figure 3:
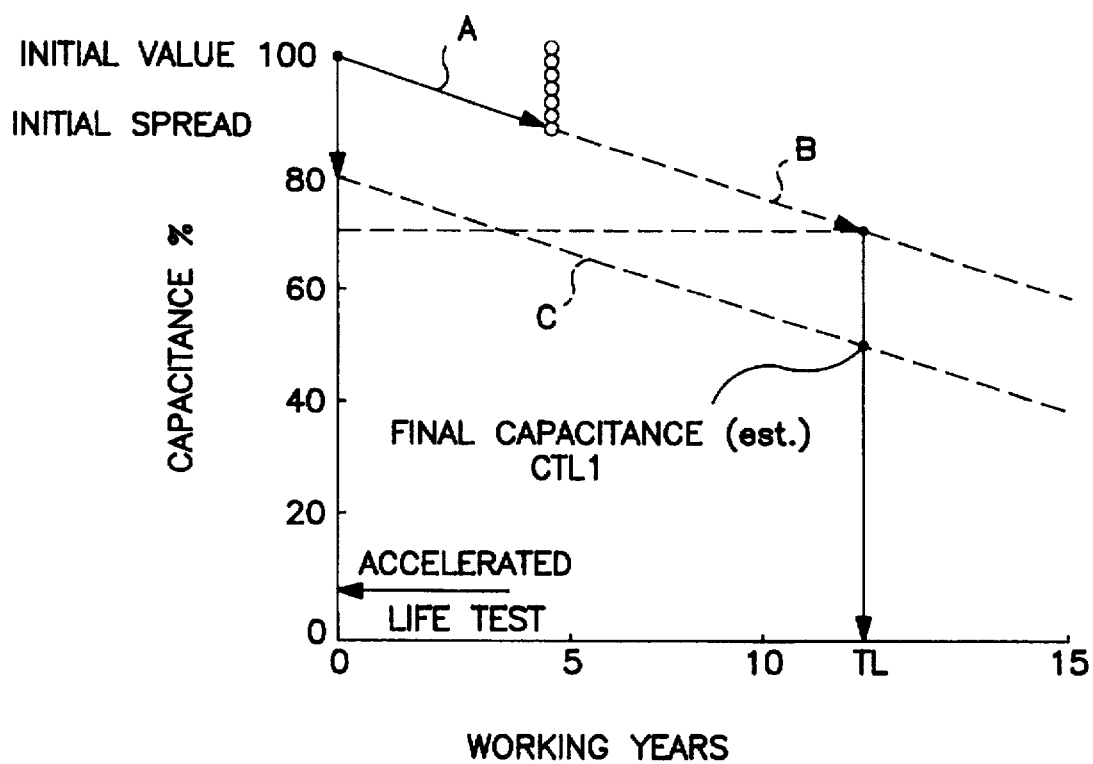
FIG. 3 is life characteristics chart of an electrolytic capacitor constituting a module circuits.

FIG. 3 is life characteristics chart showing the change in capacitance of an electrolytic capacitor with the passage of time. The characteristics data acquired through the above described accelerated life test are multiplied by an acceleration factor to obtain the degradation status for a certain working period; which is put on a graph in solid line A in FIG. 3.

Assuming the acceleration factor as e.g. 13, then 600× 13=7800 h. In a case of television receiver, assuming the viewing time per day as 8 h, the yearly hour becomes 1920 h. As 7800/1920≈4, the above described accelerated life test presents data on the degradation status corresponding to approximately 4 working years. Connect the lowest(most degraded) value with the initial value, then a solid line A is obtained.

In the case of an electrolytic capacitor, the reliability characteristic of capacitance(the change with the passage of time) shows almost straight line degradation from the initial value until it reaches 30% degradation. Therefore, the lapse time TL until it reaches the 30% degradation point is obtained by extrapolation as shown with a dotted line B in the graph [Procedure (3) in FIG. 1].

There are ±20% spread in the initial capacitance values of electrolytic capacitors. The degradation status corresponding to the worst −20% is obtained as shown with a line C in the graph. And then, the prospective capacitance CTL1 at the lapse time TL is given. Further taking the temperature characteristic at that time, namely the low temperature characteristic is about 70% of that in normal temperature, into consideration, the capacitance CTL2 after degradation, including the initial spread and the temperature characteristic, is represented against the rated value CO as follows:

$$CTL2 = CO \times 0.7(\text{degradation factor}) \times 0.8(\text{initial spread}) \times 0.7(\text{temperature characteristic})$$
$$= 0.392\,CO$$

From the above, the smallest value including the spread if initial value and the temperatures characteristic is obtained [Procedure (4) in FIG. 1].

As a practical example, assuming CO=10μF, then CTL2= 3.92 μSF.

Next, the characteristics of module circuits as shown in FIG. 2 are to be confirmed after replacing all of the constituent capacitors 2 with those having capacitance not higher than the value CTL2 obtained by the above procedure [Procedure (5) in FIG. 1]. In the above described example, capacitors of 3.3 μF may be used in practice for the confirmation purpose.

If the results prove to be normal, the status at lapse time TL may be regarded to have been confirmed with the largest spread and the highest temperature. Therefore, the module circuits under discussion may be estimated to have the life time TL (e.g. 12 years) [Procedure (6)].

In the above embodiment, the life time is found by assuming the predetermined rate of deterioration as 30%; a reverse way is also possible, viz. first obtaining the rate of deterioration needed to reach a predetermined target life time, and then confirm the characteristics based on the value.

In the above embodiment, the product assurance has been conducted based on the change(degradation) in capacitance value of electrolytic capacitor. The confirmation of reliability assurance can be made with a higher accuracy if conducted taking the tanγ of electrolytic capacitor into consideration, instead of conducting according to the method written above.

In the foregoing descriptions, an electrolytic capacitor has been employed as an example of the component to be assessed. However, in a case where there is a constituent component, in a module circuits, that is more dominant than the electrolytic capacitor in giving influence to life, the estimation of life should preferably be made with the most dominant component as the subject of assessment.

Test conditions for the accelerated life test are not limited to those described in the above embodiment. Appropriate conditions may be established depending on the purpose of application, working environment of the module circuits, and the kind of the component to be assessed. In obtaining the capacitance value CTL2, the spread and the temperature characteristic are taken into consideration as a preferred embodiment; these, however, are not essential, but may be eliminated depending on the purpose of application, working environment, etc. of the module circuits. In order to raise the accuracy of life estimation, it is recommended to take into consideration the range of actual temperature within which a module circuits is working. Or, the environmental characteristics which include the humidity characteristic, the ambient characteristic, etc. may be added depending the needs, in addition to the temperature characteristic.

As described in the foregoing passages, a method of estimating the reliability according to the present invention enables to confirm the reliability and assure the quality of a module circuits at high precision level even when a full-scale accelerated life test on module circuits itself is inpracticable due to limitation in the time before shipment date. Thus, the present invention reveals substantial effects in many practical aspects.

What is claimed is:

1. A method for estimating the reliability of a modular circuit which comprises a printed circuit board having a printed circuit and electronic components mounted thereon and connected to said printed circuit, comprising the steps of:

finding a degradation characteristic of a component mounted on said modular circuit by an accelerated life test, and determining an elapsed time for reaching a predetermined rate of deterioration as a life time;

determining at least one of:
  a) a minimum value of said component and
  b) a characteristic rate of degradation of said component for determining a characteristic deterioration of said component corresponding said to said life time;

replacing said component with another component having one of:
  a) a further minimum value not higher than said than said minimum value of said component, and
  b) a further characteristic rate of degradation not lower than said characteristic rate of degradation of said component on said modular circuit, and confirming, while simultaneously maintaining all other components of said printed circuit connected to said printed circuit, whether said modular circuit functions as intended.

2. The estimation method of claim 1, wherein said determining step for determining at least one of said minimum value of said component and said characteristic rate of degradation of said component is based upon a spread in at least one of a plurality of characteristics of said component.

3. The estimation method of claim 2, wherein said determining step for determining at least one of said minimum value of said component and characteristic rate of degradation of said component is further based upon at least one of a plurality of environmental characteristics including a temperature characteristic of said component.

4. The estimation method of claim 3, wherein said temperature characteristic is within a range of actual temperatures in which said modular circuit functions as intended.

5. A method of estimating the reliability of a modular circuit which comprises a printed circuit board having a printed circuit and electronic components mounted thereon and connected to said printed circuit, comprising the steps of:

finding at least one degradation characteristic of a component mounted on said modular circuit by an accelerated life test, and determining at least one of
  a) a minimum value of said component and
  b) a characteristic rate of degradation of said component corresponding to a predetermined life time of said component;
replacing said component with another component having one of;
  a) a further minimum value not higher than said minimum value of said component, and
  b) a characteristic not lower than said characteristic rate of degradation of said component on said modular circuit, and
confirming, while simultaneously maintaining all other components of said printed circuit connected to said printed circuit, whether said modular circuit functions as intended.

6. The estimation method of claim 5, wherein said finding step for determining said minimum value of said component and said characteristic rate of degradation of said component is based upon a spread in at least one of a plurality of characteristics of said component.

7. The estimation method of claim 6, wherein said finding step for determining said minimum value of said component and characteristic rate of degradation of said component is further based upon a plurality of environmental characteristics including a temperature characteristic of said component.

8. The estimation method of claim 7, wherein said temperature characteristic is within a range of actual temperatures in which said modular circuit functions as intended.

9. A method of estimating the reliability of a modular circuit which comprises a printed circuit board having a printed circuit and electronic components mounted thereon and connected to said printed circuit, comprising the steps of:
  selecting a component suitable for an accelerated life test from a plurality of components which will be mounted on said modular circuit;
  finding a degradation characteristic of said component selected by an accelerated life test, and determining an elapsed time for reaching a predetermined rate of deterioration as a life time;
  determining at least one of:
    a) a minimum value of said component and
    b) a characteristic rate of degradation of said component based on said life time;
  replacing said component with another component having one of:
    a) a value not higher than said minimum value of said components and
    b) a characteristic not lower than said characteristic rate of degradation of said component on said modular circuit, and
  confirming, while simultaneously maintaining all other components of said printed circuit connected to said printed circuit, whether said modular circuit functions as intended.

10. The estimation method of claim 9, wherein said selected component is a component which dominates the life of said modular circuit.

11. The estimation method of claim 10, wherein said selected component is an electrolytic capacitor.

12. The estimation method of claim 9, wherein each of said steps is based upon a plurality of components.

13. A method of estimating the reliability of a modular circuit which comprises a printed circuit board having a printed circuit and electronic components mounted thereon and connected to said printed circuit, comprising the steps of:
  selecting a component from a plurality of components to be mounted on a modular circuit suitable for an accelerated life test;
  measuring a plurality of initial characteristic values of said selected component;
  conducting the accelerated life test on said selected component;
  measuring a plurality of values of said characteristics after the accelerated life test corresponding to said plurality of initial characteristic values;
  finding at least one of a degradation value and a rate of degradation based on said plurality of initial characteristic values and the plurality of values of said characteristics after said accelerated life test;
  determining a life time by comparing said rate of degradation and a predetermined rate of deterioration;
  determining a minimum value of said component for determining a deterioration of said plurality of characteristics of said component corresponding to said life time;
  replacing said component with another component having a further value not higher than said minimum value of said component on said modular circuit, and
  confirming, while simultaneously maintaining all other components of said printed circuit connected to said printed circuit, whether said modular circuit functions as intended.

14. The estimation method of claim 13, wherein said step of determining said minimum value of said component is based upon a spread in at least one of a plurality of characteristics of said component.

15. The estimation method of claim 13, wherein said step of determining said minimum value of said component is based upon at least one of a plurality of environmental characteristics including a temperature characteristic of said component.

16. The estimation method of claim 13, wherein said accelerated life test applies a rated voltage to said component for a predetermined time at a predetermined temperature and humidity.

17. The estimation method of claim 9, wherein said accelerated life test applies a rated voltage to said component for a predetermined time at a predetermined temperature and humidity.

18. The estimation method of claim 5, wherein said accelerated life test applies a rated voltage to said component for a predetermined time at a predetermined temperature and humidity.

19. The estimation method of claim 1, wherein said accelerated life test applies a rated voltage to said component for a predetermined time at a predetermined temperature and humidity.

20. The estimation method of claim 9, wherein ones of the plurality of components are of a different type from one another.

21. The estimation method of claim 20, wherein the plurality of components of the different type include at least one of the group consisting of: a capacitor, a resistor, an integrated circuit, a transistor, and an inductor.

22. The estimation method of claim 13, wherein ones of the plurality of components are of a different type from one another.

23. The estimation method of claim 22, wherein the plurality of components of the different type include at least one of the group consisting of: a capacitor, a resistor, an integrated circuit, a transistor, and an inductor.

* * * * *

UNITED STATES PATENT AND TRADE MARK OFFICE
CERTIFICATE OF CORRECTION

PATENT NO.   : 5,764,073
DATED        : June 9, 1998
INVENTOR(S)  : Sadamatsu

It is certified that error appears in the above-identified patent and that said Letters Patent is hereby corrected as shown below:

Column 4, line 37, delete second occurrence "said".

Column 6, line 25, "confirming,..." should begin a new paragraph.

Signed and Sealed this

Twenty-sixth Day of January, 1999

Attest:

Attesting Officer

*Acting Commissioner of Patents and Trademarks*